United States Patent
Zhang et al.

(10) Patent No.: US 7,700,967 B2
(45) Date of Patent: Apr. 20, 2010

(54) ILLUMINATION DEVICE WITH A WAVELENGTH CONVERTING ELEMENT HELD BY A SUPPORT STRUCTURE HAVING AN APERTURE

(75) Inventors: Li Zhang, San Jose, CA (US); Franklin J. Wall, Jr., Vacaville, CA (US); Richard S. Kern, Los Altos, CA (US); Jeffrey D. Kmetec, Palo Alto, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 0 days.

(21) Appl. No.: 11/754,210

(22) Filed: May 25, 2007

(65) Prior Publication Data

US 2008/0290362 A1 Nov. 27, 2008

(51) Int. Cl.
*H01L 33/00* (2006.01)
(52) U.S. Cl. .......................................................... 257/99
(58) Field of Classification Search ........... 257/79–100, 257/116, 117, 432–437, 749, E33.056–E33.059, 257/E25.032
See application file for complete search history.

(56) References Cited

U.S. PATENT DOCUMENTS

| | | | |
|---|---|---|---|
| 6,357,889 B1 | 3/2002 | Duggal et al. | |
| 6,809,342 B2 * | 10/2004 | Harada | ........................ 257/79 |
| 2002/0079837 A1 | 6/2002 | Okazaki | |
| 2003/0230751 A1 | 12/2003 | Harada | |
| 2004/0256974 A1 | 12/2004 | Mueller-Mach et al. | |
| 2005/0045901 A1 | 3/2005 | Wall, Jr. | |
| 2005/0269582 A1 | 12/2005 | Mueller et al. | |
| 2006/0124953 A1 * | 6/2006 | Negley et al. | .................. 257/99 |
| 2008/0123339 A1 * | 5/2008 | Bierhuizen et al. | .......... 362/293 |

FOREIGN PATENT DOCUMENTS

| | | |
|---|---|---|
| JP | 2006179684 A | 7/2006 |
| JP | 2007031196 A | 2/2007 |

\* cited by examiner

*Primary Examiner*—Dao H Nguyen
*Assistant Examiner*—Tram H Nguyen

(57) ABSTRACT

An illumination device includes a light source, such as one or more light emitting diodes and a wavelength converting element that is mounted on an opaque support structure. The support structure includes an aperture with which the wavelength converting element is aligned so that the converted light is emitted through the aperture. The wavelength converting element may be a rigid structure, such as a luminescent ceramic and the aperture may be a hole through the support structure. The support structure may hold the wavelength converting element so that it is physically separated from the light source, or alternatively, the support structure may place the wavelength converting element in physical contact with the light source.

25 Claims, 3 Drawing Sheets

US 7,700,967 B2

ILLUMINATION DEVICE WITH A WAVELENGTH CONVERTING ELEMENT HELD BY A SUPPORT STRUCTURE HAVING AN APERTURE

FIELD OF THE INVENTION

The present invention is related to an illumination device and, in particular, to the wavelength conversion of light produced by high radiance light sources, such as semiconductor light emitting devices.

BACKGROUND

Lighting devices that use light emitting diodes (LEDs) are becoming increasingly common in many lighting applications. Generally, LEDs use phosphor conversion of the primary emission to generate white light, but phosphors can also be used to create more saturated colors like red, green and yellow.

Conventional devices that place the phosphor in physical contact with the LEDs suffer from disadvantages such as a limited bonding temperature range. Moreover, the bonding material choice can impact cost as well as reliability, e.g., caused by thermally induced mechanical stress. Accordingly, improvements are desirable.

SUMMARY

In accordance with an embodiment of the present invention, an illumination device includes a light source, such as one or more light emitting diodes and a wavelength converting element that is mounted on an opaque support structure. The support structure includes an aperture with which the wavelength converting element is aligned so that the converted light is emitted through the aperture. The wavelength converting element may be a rigid structure, such as a luminescent ceramic and the aperture may be a hole through the support structure. The support structure may hold the wavelength converting element so that it is physically separated from the light source, or alternatively, the support structure may place the wavelength converting element in physical contact with the light source.

DETAILED DESCRIPTION

In accordance with an embodiment of the present invention, the wavelength converting element in an illumination device is physically supported by an structure that includes an aperture through which the converted light and a portion of the pump light, if desired, may be emitted.

Figure 1:
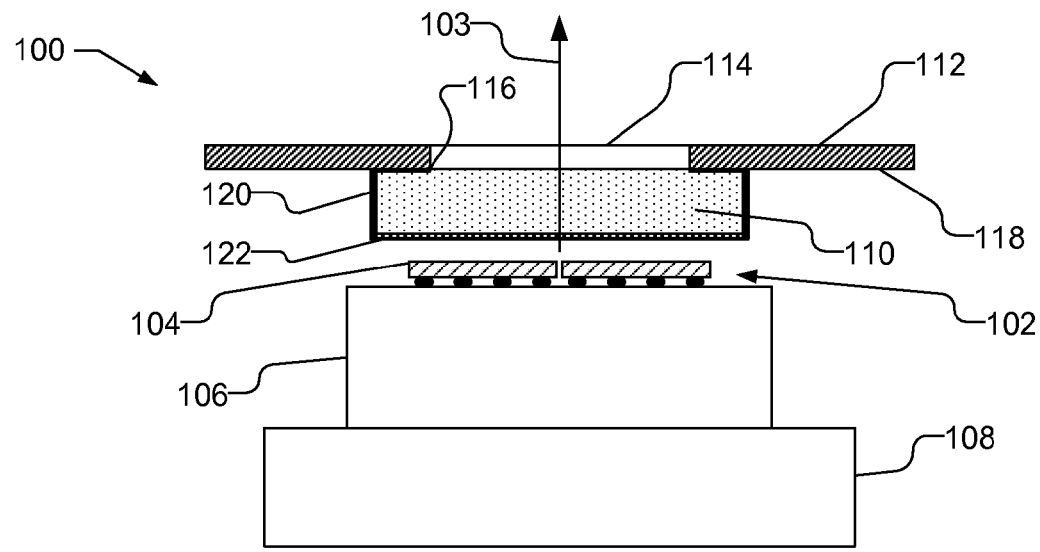
FIG. 1 is a side view of an illumination device in accordance with one embodiment of the present invention

FIG. 1 is a side view that illustrates an illumination device 100 in accordance with one embodiment of the present invention. The illumination device 100 includes a light source 102, which may be, e.g., a semiconductor light emitting device, such as one or more light emitting diodes (LED) 104, or other types of light sources that can produce short wavelength light, such as a Xenon lamp or Mercury lamp. By way of example, the LEDs 104 are blue or ultraviolet (UV) LEDs and may be high radiance devices, such as the type described in U.S. Ser. No. 10/652,348, entitled "Package for a Semiconductor Light Emitting Device", by Frank Wall et al., filed Aug. 29, 2003, Pub. No. 2005/0045901, having the same assignee as the present disclosure and which is incorporated herein by reference. The angular emission pattern of the LEDs 104 can be lambertian or controlled using a photonic crystals such as lattice structures. The light emitting diodes 104 are illustrated as being mounted on a submount 106, which may be, e.g., ceramic or silicon and may include the necessary electrical contacts for the LEDs 104. The submount 106 may be mounted on a heatsink 108. If desired, support structures other than the submount 106 and heatsink 108 may be used.

Illumination device 100 includes a wavelength converting element 110 that is mounted on and held by a support structure 112 that includes an aperture 114. While not shown in FIG. 1, the support structure 112 may be physically mounted or connected to various parts of the illumination device as will be discussed below. The aperture 114 is positioned over wavelength converting element 110 to transmit the forward emitted light from wavelength converting element 110 (and any pump light from LEDs 104 that passes through wavelength converting element 110). In one embodiment, the support structure 112 may be produced so that the aperture 114 is a hole through support structure 112, which may be manufactured from an opaque material through stamping, molding or machining. The support structure 112, by way of example, may be manufactured from a metal or metal alloy, such as aluminum, copper, or other appropriate material. The wavelength converting element 110 is attached to the overlapping portion 116 of the support structure 112 by, e.g., by epoxy, glass, solder or other appropriate material. In another embodiment, the support structure 112 may be manufactured from a transparent material, e.g., LCP (liquid crystal polymer) glass, silicon, or other appropriate material, that is coated with a reflective material, e.g., on the surface 118 to which the wavelength converting element 110 is attached. In such an embodiment, the aperture 114 is defined by the absence of the reflective material.

By mounting the wavelength converting element 110 to the support structure 112, as opposed to the light source 102, the assembly of the illumination device 100 is simplified and avoids exposing the LEDs 104 to large temperature excursions. Moreover, the support structure 112 blocks blue light leakage while the wavelength converting element 110 blends the light from multiple dice while potentially providing an apparent contiguous light source.

In one embodiment, the sides of the wavelength converting element 110 may be covered with a reflective coating 120, such as a layer of aluminum, silver, or 3M ESR reflective film or any other appropriate reflective material, to recycle side emitted light from the wavelength converting element 110. Moreover, the overlapping portion 116 of the support structure 112 and/or the bonding material may be reflective to increase the recycling of the light that is not emitted through the aperture 114.

The wavelength converting element 110 may be formed from a rigid material, particularly in the embodiment in which the aperture 114 is formed as a hole through the support structure 112. By way of example, the wavelength converting element 110 may be a ceramic slab, sometimes referred to herein as a "luminescent ceramic". The ceramic slabs are generally self-supporting layers and may be translucent or transparent to particular wavelengths, which may reduce the scattering loss associated with non-transparent wavelength converting layers such as conformal layers. Luminescent ceramic layers may be more robust than thin film or conformal phosphor layers. In some embodiments, materials other than luminescent ceramics may be used as the wavelength converting element 110, such as phosphors in a binder material.

Examples of phosphors that may be formed into luminescent ceramic layers include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$ which emit light in the yellow-green range; and $(Sr_{1-x-y}Ba_x Ca_y)_{2-z}Si_{5-a}Al_aN_{8-a}O_a:Eu_z^{2+}$ wherein $0\leq a<5$, $0<x\leq1$, $0\leq y\leq1$, and $0<z\leq1$ such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red emitting phosphors may also be suitable, including $(Sr_{1-a-b}Ca_bBa_c)Si_x N_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yIn_z S_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0<x\leq1$ including, for example, $CaS:Eu^{2+}$ and $SrS:Eu^{2+}$.

A luminescent ceramic may be formed by heating a powder phosphor at high pressure until the surface of the phosphor particles begin to soften and melt. The partially melted particles stick together to form a rigid agglomerate of particles. Unlike a thin film, which optically behaves as a single, large phosphor particle with no optical discontinuities, a luminescent ceramic behaves as tightly packed individual phosphor particles, such that there are small optical discontinuities at the interface between different phosphor particles. Thus, luminescent ceramics are optically almost homogenous and have the same refractive index as the phosphor material forming the luminescent ceramic. Unlike a conformal phosphor layer or a phosphor layer disposed in a transparent material such as a resin, a luminescent ceramic generally requires no binder material (such as an organic resin or epoxy) other than the phosphor itself, such that there is very little space or material of a different refractive index between the individual phosphor particles. As a result, a luminescent ceramic is transparent or translucent, unlike a conformal phosphor layer. For more information related to a luminescent ceramic that may be used with the present invention, see U.S. Pub. No. 2005/0269582, which is incorporated herein by reference.

An anti-reflective coating 122 is deposited on the input side of the wavelength converting element 110, so that the anti-reflective coating 122 is between the wavelength converting element 110 and the LEDs 104. In another embodiment, the coating 122 may be a color separation element, such as a dichroic filter, which transmits the blue pump light and reflects the wavelengths in the range of the light converted by the wavelength converting element 110. The color separation element 116 may be a high angular acceptance coating that is directly applied to the input side 111 of the wavelength converting element 110, which is facing the light source 102.

As illustrated in FIG. 1, the support structure 112 may be positioned so that the wavelength converting element 110 is physically separated from the light source 102 along the optical path (generally illustrated by arrow 103). Thus, the wavelength converting element 110 (and the anti-reflective coating 122) is not in contact with the light source 102. The medium between the wavelength converting element 110 (and the anti-reflective coating 122), and the light source 102 may be, e.g., air, gas, or a vacuum. Thus, light emitted by the light source 102 must travel through the gap between the light source 102 and the wavelength converting element 110 (and the anti-reflective coating 122). The length of the physical separation between the light source 102 and the wavelength converting element 110 may vary, but in one embodiment is in the range of 50 μm-250 μm. In one embodiment, the physical separation between the light source 102 and the wavelength converting element 110 is sufficient to prevent substantial conductive heating of the wavelength converting element 110 by the light source 102. In another embodiment, a filler or bonding material, such as silicone gel or other appropriate material, may be used to fill the gap between the light source 102 from the wavelength converting element 110.

Figure 2:
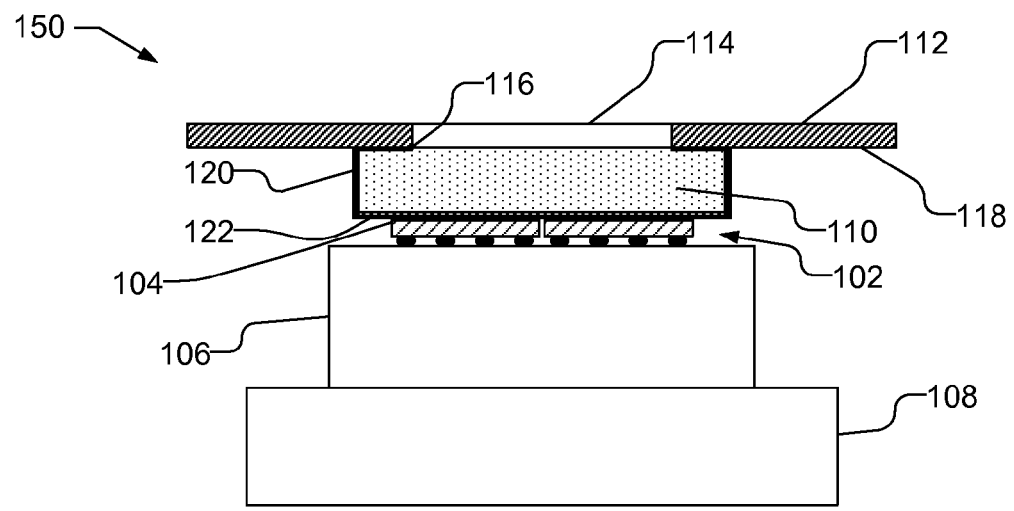
FIG. 2 is a side view of an illumination device similar to that shown in FIG. 1, but with the wavelength converting element in physical contact with the light source.

FIG. 2 is a side view that illustrates an illumination device 150, in accordance with another embodiment of the present invention. The illumination device 150 is substantially similar to the illumination device 100, shown in FIG. 1, like designated elements being the same. However, as illustrated in FIG. 2, the support structure 112 in the illumination device 150 holds the wavelength converting element 110 so that there is no gap between the wavelength converting element 110 and the light source 102, i.e., the wavelength converting element 110 is in physical contact with the light source 102 via the anti-reflective coating 122. The wavelength converting element 110 may be bonded to the light source 102 if desired for optimal optical coupling.

Figure 3:
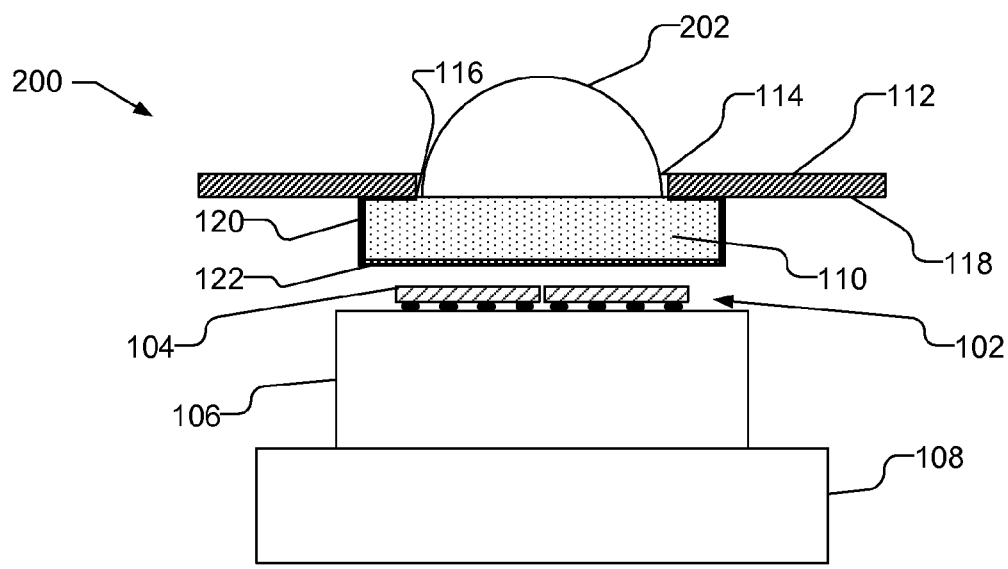
FIG. 3 is an illumination device similar to that shown in FIG. 1, but with an optical element mounted in the aperture of the support structure.

FIG. 3 is a side view that illustrates an illumination device 200, which is substantially similar to the illumination device 100, shown in FIG. 1, like designated elements being the same. The illumination device 200, however, includes an optical element 202, such as a dome lens within the aperture 114. The optical element 202 may be mounted to the wavelength converting element 110 through the aperture 114. Alternatively, if the support structure 112 is a transparent material with a reflective coating to define the aperture 114, the optical element 202 may be bonded to or integrally formed with the support structure 112. It should be understood that the support structure 112 of illumination device 200 may be positioned to place the wavelength converting element 110 in contact with the light source 102, as illustrated in FIG. 2.

Figure 4:
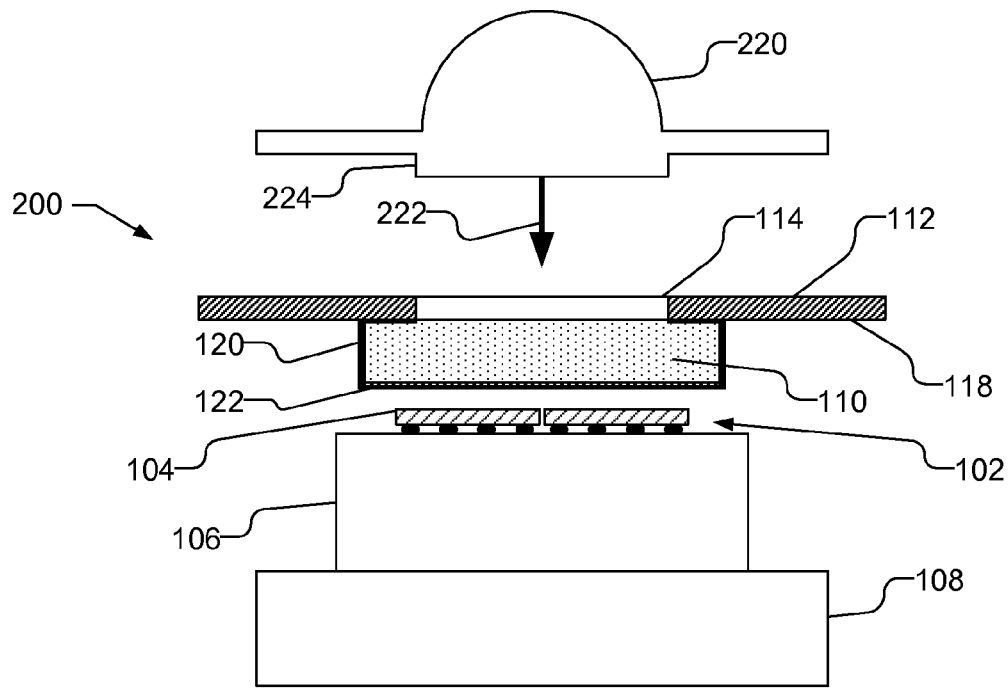
FIG. 4 illustrates an external optical element that is attached to the illumination device using the aperture in the supports structure as a registration.

One advantage of the use of support structure 112 with aperture 114 is that the aperture 114 may be used as a registration to mount additional elements to illumination device 100 or alternatively, to mount the illumination device 100 to another structure. By way of example, FIG. 4 illustrates an optical element 220 being attached to the illumination device 100, as illustrated by arrow 222. The optical element 220 includes a protrusion 224 that is sized to fit aperture 114. Thus, aperture 114 acts as a registration for optical element 220. Of course, other optical or non-optical elements may use aperture 114 for registration.

Figure 5:
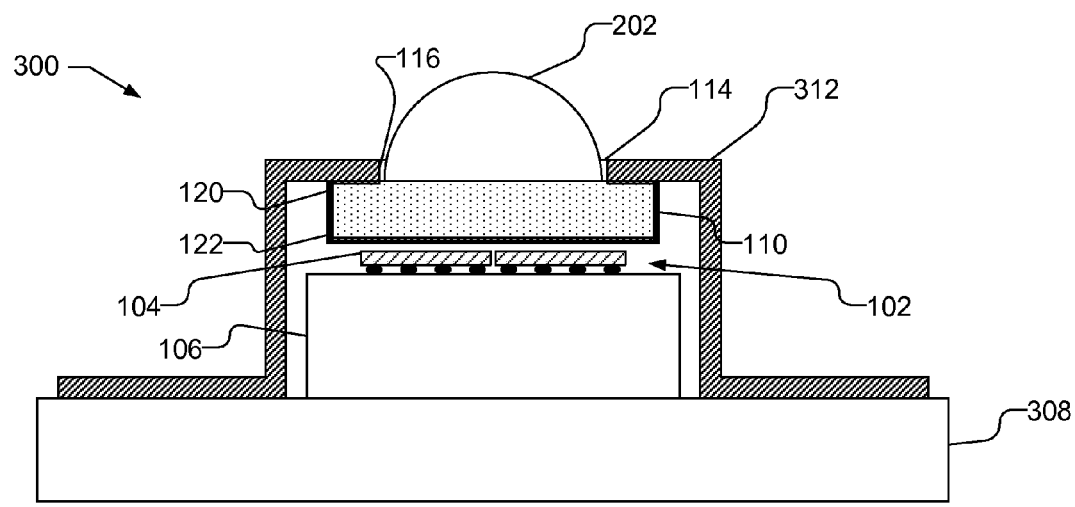
FIG. 5 illustrates an illumination device similar to that shown in FIG. 1, with the support structure mounted to an enlarged substrate.
Figure 6:
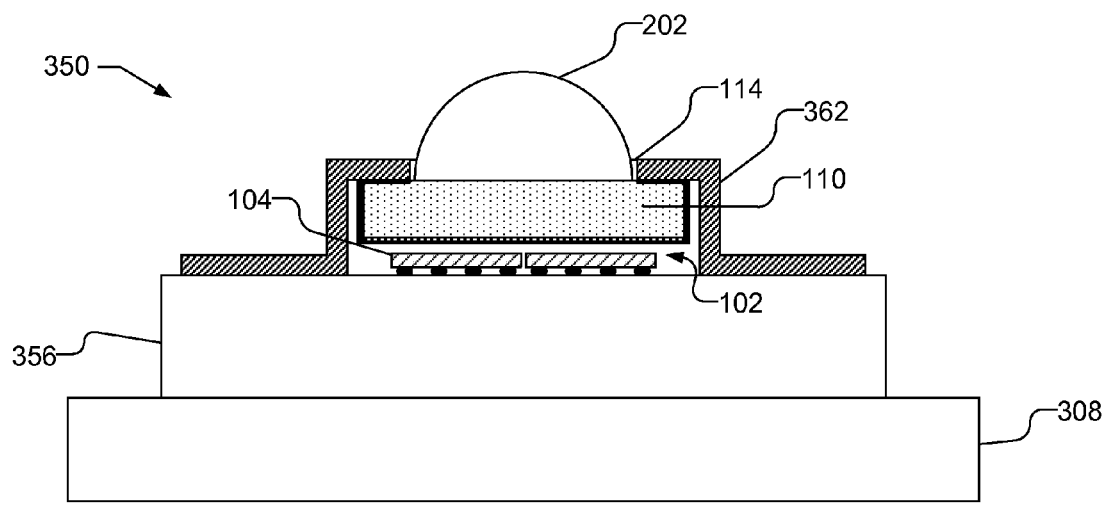
FIG. 6 illustrates an illumination device similar to that shown in FIG. 1, with the support structure mounted to the heatsink.

FIG. 5 illustrates a side view of an illumination device 300 that is similar to illumination device 200 shown in FIG. 3, but with the support structure 312 mounted to an enlarged substrate 308. FIG. 6 is similar to FIG. 5, but with an illumination device 350 having a support structure 362 being mounted to the heatsink 356, which may provide a hermetically sealed environment for the light source 102.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
a light source emitting light;
a wavelength converting element that receives the emitted light from the light source, the wavelength converting element at least partially converting the emitted light and producing converted light;
an opaque support structure having an aperture, the wavelength converting element being mounted on and held by a bottom surface of the opaque support structure and aligned with the aperture so that the converted light produced by the wavelength converting element is emitted through the aperture.

2. The apparatus of claim 1, wherein the wavelength converting element is a rigid self-supporting material.

3. The apparatus of claim 1, wherein the wavelength converting element is a luminescent ceramic.

4. The apparatus of claim 1, wherein the aperture is a hole through the support structure.

5. An apparatus comprising:
a light source emitting light;
a wavelength converting element that receives the emitted light from the light source, the wavelength converting element at least partially converting the emitted light and producing converted light;
an opaque support structure having an aperture, the wavelength converting element being mounted on and held by a bottom surface of the opaque structure and aligned with the aperture so that the converted light produced by the wavelength converting element is emitted through the aperture, wherein the support structure is formed from a transparent material coated with a reflective layer that defines the aperture.

6. The apparatus of claim 1, further comprising an optical element coupled to the aperture.

7. The apparatus of claim 6, wherein the optical element is mounted to the wavelength converting element through the aperture.

8. The apparatus of claim 6, wherein the optical element is integrally formed with the opaque support structure and aperture.

9. The apparatus of claim 1, further comprising an optical element that is mounted to the opaque support structure using the aperture for a registration.

10. The apparatus of claim 1, wherein the light source comprises at least one light emitting diode.

11. The apparatus of claim 10, further comprising a substrate, the at least one light emitting diode being coupled to the substrate and the opaque support structure being coupled to the substrate.

12. The apparatus of claim 10, further comprising a heatsinik, the at least one light emitting diode being coupled to the heatsinik and the opaque support structure being coupled to the heatsink.

13. The apparatus of claim 1, wherein the opaque support structure holds the wavelength converting element so that it is not in physical contact with the light source.

14. The apparatus of claim 1, wherein the opaque support structure holds the wavelength converting element so that it is in physical contact with the light source.

15. The apparatus of claim 1, further comprising an anti-reflective coating on the wavelength converting element, the anti-reflective coating being located between the wavelength converting element and the light source.

16. An apparatus comprising:
a light source including at least one light emitting diode that emits light;
a luminescent ceramic that receives the emitted light from the light source and at least partially converts the emitted light, the luminescent ceramic producing a converted light; and
an opaque support structure having an aperture, the luminescent ceramic being mounted on and held by a bottom surface of the opaque structure such that a portion of the support structure is disposed over a top surface of the luminescent ceramic, the luminescent ceramic being aligned with the aperture so that the converted light produced by the luminescent ceramic is emitted through the aperture.

17. The apparatus of claim 16, wherein the aperture is a hole through the opaque support structure.

18. The apparatus of claim 16, wherein the opaque support structure is formed from a transparent material coated with a reflective layer that defines the aperture.

19. The apparatus of claim 16, further comprising an optical element coupled to the aperture.

20. The apparatus of claim 19, wherein the optical element is mounted to the luminescent ceramic through the aperture.

21. The apparatus of claim 19, wherein the optical element is integrally formed with the opaque support structure and aperture.

22. The apparatus of claim 16, further comprising an optical element that is mounted to the opaque support structure using the aperture for a registration.

23. The apparatus of claim 16, wherein the opaque support structure holds the luminescent ceramic so that it is not in physical contact with the light source.

24. The apparatus of claim 16, wherein the opaque support structure holds the luminescent ceramic so that it is in physical contact with the light source.

25. The apparatus of claim 16, farther comprising an anti-reflective coating on the luminescent ceramic, the anti-reflective coating being located between the luminescent ceramic and the light source.

* * * * *